United States Patent
Nomoto et al.

(10) Patent No.: US 6,503,775 B2
(45) Date of Patent: Jan. 7, 2003

(54) PRODUCTION METHOD OF A MICROMACHINE

(75) Inventors: Satoru Nomoto, Aichi-ken (JP); Masayoshi Takeuchi, Aichi-ken (JP); Shuji Noda, Aichi-ken (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 0 days.

(21) Appl. No.: 09/956,799

(22) Filed: Sep. 21, 2001

(65) Prior Publication Data

US 2002/0037601 A1 Mar. 28, 2002

(30) Foreign Application Priority Data

Sep. 22, 2000 (JP) .................................... 2000-287966

(51) Int. Cl.$^7$ ............................................. H01L 21/00
(52) U.S. Cl. ......................................... 438/52; 257/415
(58) Field of Search ............................. 438/29, 42, 48, 438/50–53, 238, 330, 409, 411, 456, 619, 689, 694, 702–703, 734–735, 719, 756–757, 739, 745, 753; 257/108, 415, 417–420, 409, 431, 434, 436, 247–248, 254, 700, 710, 790, 794, 787–788

(56) References Cited

U.S. PATENT DOCUMENTS

| | | | |
|---|---|---|---|
| 5,559,358 A | * | 9/1996 | Burns et al. ................ 257/415 |
| 5,620,931 A | | 4/1997 | Tsang et al. |
| 5,721,377 A | | 2/1998 | Kurle et al. |
| 5,936,164 A | * | 8/1999 | Sparks et al. ................ 73/724 |
| 5,963,788 A | * | 10/1999 | Barron et al. ...... 148/DIG. 105 |
| 6,012,336 A | * | 1/2000 | Eaton et al. ................ 73/754 |
| 6,342,427 B1 | * | 1/2002 | Choi et al. ................ 216/2 |

* cited by examiner

*Primary Examiner*—David Nelms
*Assistant Examiner*—David Vu
(74) *Attorney, Agent, or Firm*—Sughrue Mion, PLLC

(57) ABSTRACT

A production method of a micromachine includes a polysilicon film forming step which overlays grooves, defined in an upper surface of a sacrificial layer on a silicon substrate, with polysilicon layer so as to be flat. The production method includes a first processing step for filling the grooves by adding a lower laid portion of the polysilicon layer onto a sacrificial layer. The lower laid portion has a thickness greater than 0.625 times relative to a width of the grooves. The production method of the micromachine further includes a second processing step for making the polysilicon layer to have a predetermined thickness by adding a upper laid portion of the polysilicon layer on the lower laid portion to form the polysilicon layer, the upper laid portion formed by depositing polysilicon which has the same impurity concentration as the lower laid portion does.

4 Claims, 8 Drawing Sheets

PRODUCTION METHOD OF A MICROMACHINE

CROSS REFERENCE TO RELATED APPLICATION

This application is based on and claims priority under 35 U.S.C. §119 with respect to Japanese Patent application NO. 2000-287966 filed on Sept. 22, 2000, the entire content of which is incorporated herein by reference.

FIELD OF THE INVENTION

This invention relates to a production method of a micromachine. More specifically, this invention relates to the production method employing a surface machining.

BACKGROUND OF THE INVENTION

Conventionally, micromachining sensors (or micromachined sensors) have been produced by production methods for a micromachine employing surface machining. The angular speed sensor having a pectinated electrostatic oscillator is produced as one of the micromachining sensors. To make the pectinated electrostatic oscillator of the angular speed sensor, first of all, a polysilicon layer having the thickness of approximately 2μm is formed on a silicon substrate by thermally diffusing phosphorous after depositing a non-doped polysilicon film which is similar to an amorphous silicon. Next, a micro structure which is to be the pectinated electrostatic oscillator is formed by etching the polysilicon layer.

The aforementioned polysilicon layer has concave portions which are made to be filled by another polysilicon in order to form support beams of the pectinated electrostatic oscillator. If the thickness of polysilicon layer becomes thicker from 2μm or above thickness in order to enlarge the electrostatic capacity of the pectinated electrostatic oscillator, an inner stress is generated from the concave portion in the polysilicon layer. The inner stress causes the pectinated electrostatic oscillator (formed within the polysilicon layer) to be attached to the silicon substrate, whereby the pectinated electrostatic oscillator cannot be floated from the silicon substrate.

The present invention is made to overcome the aforementioned drawback. The present invention provides a production method of the micromachine which reduces the inner stress generated in the concave portion thereof when the concave portion is made to be smooth and flat by filling the polysilicon layer having a predetermined thickness.

SUMMARY OF THE INVENTION

In accordance with the first aspect of the present invention, a production method of a micromachine includes a polysilicon film forming step for flattening grooves defined in a sacrificial layer formed on a surface of a silicon substrate by overlaying a polysilicon layer. The production method of the micromachine includes a first processing step for filling the grooves by adding a lower laid portion of the polysilicon layer onto the sacrificial layer, where the lower laid portion has a thickness of more than 0.625 times as large as a maximum width of the grooves. The production method of the micromachine further includes a second processing step for forming the polysilicon layer with a predetermined thickness by adding a upper laid portion of the polysilicon layer onto the lower laid portion, the upper laid portion being formed by depositing polysilicon which has the same impurity concentration as the lower laid portion has.

In accordance with the second aspect of the present invention, a production method of a micromachine modifies the method of the first aspect, wherein the first processing step adds the lower laid portion onto the sacrificial layer by thermal anealing after repeating a deposition of the polysilicon and an ion implantation with a low pressure chemical vapor deposition.

In accordance with the third aspect of the present invention, a production method of a micromachine modifies the method of the first aspect, wherein a micro structure floating apart from the silicon substrate is formed in the polysilicon layer.

In accordance with the fourth aspect of the present invention, wherein the micro structure is an oscillator of a micromachine sensor.

Thus, constructed present invention has the following advantages: At the first processing step, the grooves defined in the sacrificial layer are filled or flattened by overlaying the lower laid portion of the polysilicon layer which has the thickness of more than 0.625 times as large as a maximum width of the grooves, which makes the inner stress rarely generated in the lower laid portion within the grooves. At the second processing step, the polysilicon layer having the predetermined thickness is formed of the lower laid portion and the upper laid portion of the polysilicon layer by overlaying the upper laid portion on the lower laid portion.

At this time, the overlaid upper laid portion has the same impurity concentration as the lower laid portion has, which prevents the inner stress form generating in the upper laid portion. Therefore the polysilicon layer formed by the lower laid portion and the upper laid portion thereof can be in a stable state, whereby the direction of crystal face of the polysilicon layer generally indicates (110) plane direction. In addition, at the first processing step, the lower laid portion is formed on the sacrificial layer by thermal anealing after repeating a deposition of the polysilicon and an ion implantation under a low pressure chemical vapor deposition, which enables the lower laid portion to be formed by fine crystals, so that the inner stress resulted from the grooves rarely generated.

The production method of the micromachine of the present invention enables the polysilicon layer to be thickened to the predetermined level, thereby reducing the generation of the inner stress, with the result that the micro structure which has the thickness such as previously could not be formed by the surface machining can be formed in floating on the silicon substrate. When an oscillator of the micromachined sensor is constructed by the above micro structure capable of having sufficient electrostatic capacity, the production employed the surface machining increases the output power of the micromachine.

BRIEF DESCRIPTION OF THE DRAWINGS

A more complete appreciation of the invention and other advantages thereof will be readily obtained as the same becomes better understood by reference to the following detailed description when considered in connection with the accompanying drawings, wherein.

DETAILED DESCRIPTION OF THE PRESENT INVENTION

Hereinafter, preferred embodiments of a production method of a micromachine in accordance with the present invention will be described with reference to attached drawings. First of all, a first embodiment will be described with reference to FIGS. 1 to 10. The production method of the micromachine of the first embodiment is the method for producing an angular speed sensor having a pectinated electrostatic oscillator. FIGS. 1 to 10 illustrate processes of the production method in accordance with the first embodiment wherein sensing portions of the angular speed sensor having a pectinated electrostatic oscillator and the like are formed on a silicon substrate.

Figure 1:
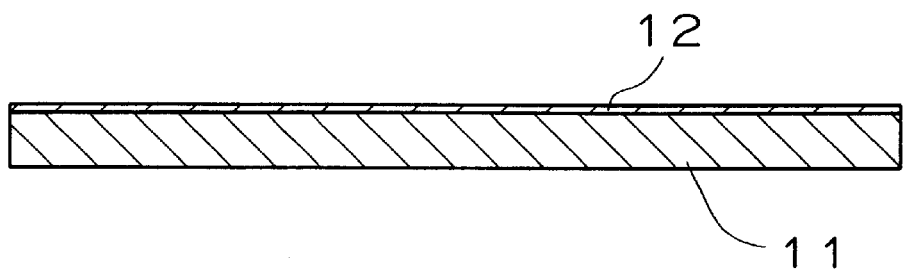
FIG. 1 shows the process drawing of the first embodiment of the production method of the micromachine of the present invention wherein sensing portions of an angular speed sensor i.e. a pectinated electrostatic oscillator and the like are formed on the silicon substrate.
Figure 2:
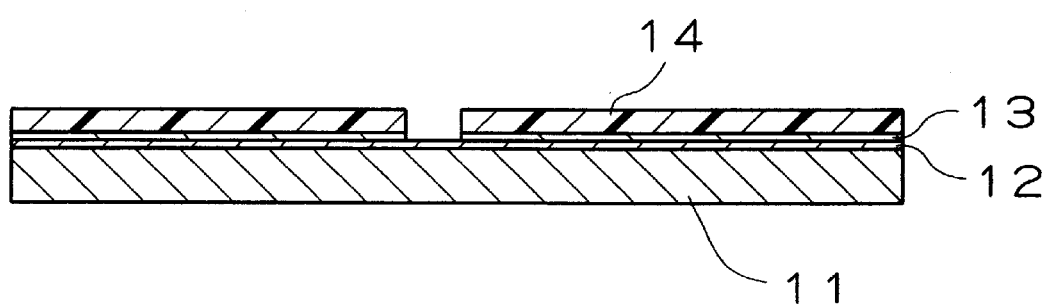
FIG. 2 shows the process drawing of the first embodiment of the production method of the micromachine of the present invention wherein sensing portions of the angular speed sensor i.e. the pectinated electrostatic oscillator and the like are formed on the silicon substrate.

According to the first embodiment of the production method of the micromachine, in order to form the sensing portion of the angular speed sensors including the pectinated electrostatic oscillator and the like on a silicon substrate 11, first of all, as shown in FIG. 1, a nitride film 12 is formed as an etch-stop layer for stopping the etching on the n type silicon substrate 11. Next, as shown in FIG. 2, a polysilicon layer 13 is formed on the nitride film 12 for providing underneath circuit of the angular sensor. After doping phosphorous and thermally annealing, a resist film 14 is formed on the polysilicon layer 13, and the polysilicon layer 13 is machined by anisotropic dry etching, so that the underneath circuit is formed or patterned on the polysilicon layer 13.

Figure 3:
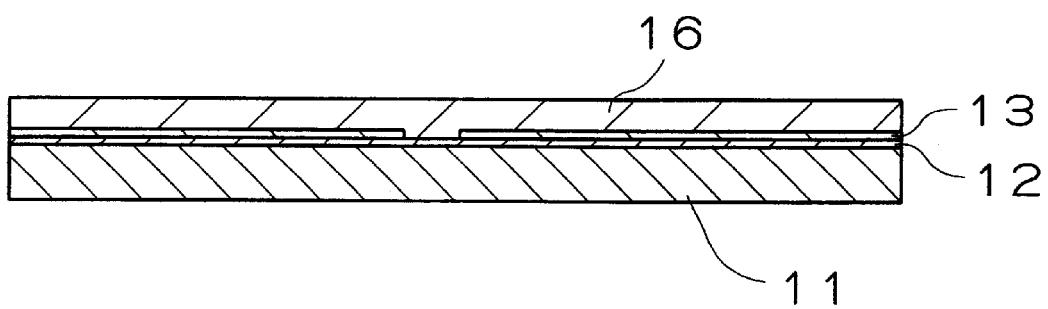
FIG. 3 shows the process drawing of the first embodiment of the production method of the micromachine of the present invention wherein sensing portions of the angular speed sensor i.e. the pectinated electrostatic oscillator and the like are formed on the silicon substrate.

Following the aforementioned processes, at the steps shown in FIGS. 2 and 3, after removing the resist film 14, a sacrificial layer i.e. a low temperature oxide (LTO) layer 16 is formed on the polysilicon layer 13. At the step shown in FIG. 4, after coating a resist film 17 on the LTO layer 16, the LTO layer 16 is machined by anisotropic dry etching, thus grooves 18 are formed in the upper surface of the LTO layer 16 with 4 µm width. The grooves 18 are made for forming supporting beams of the pectinated electrostatic oscillator. The grooves 18 are provided between the substrate 11 and a main body of the pectinated electrostatic oscillator.

Figure 5:
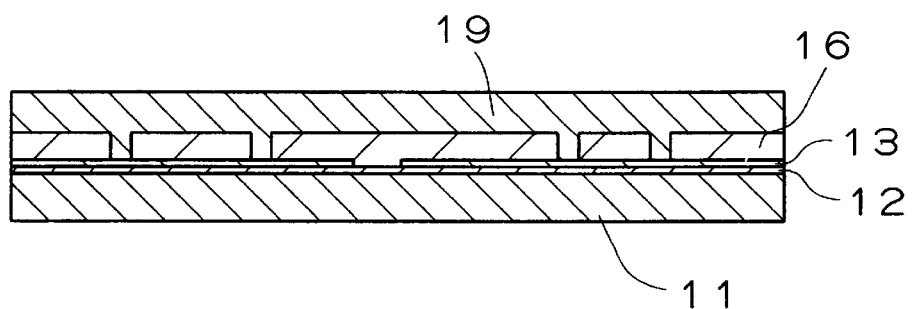
FIG. 5 shows the process drawing of the first embodiment of the production method of the micromachine of the present invention wherein sensing portions of the angular speed sensor i.e. the pectinated electrostatic oscillator and the like are formed on the silicon substrate.
Figure 6:
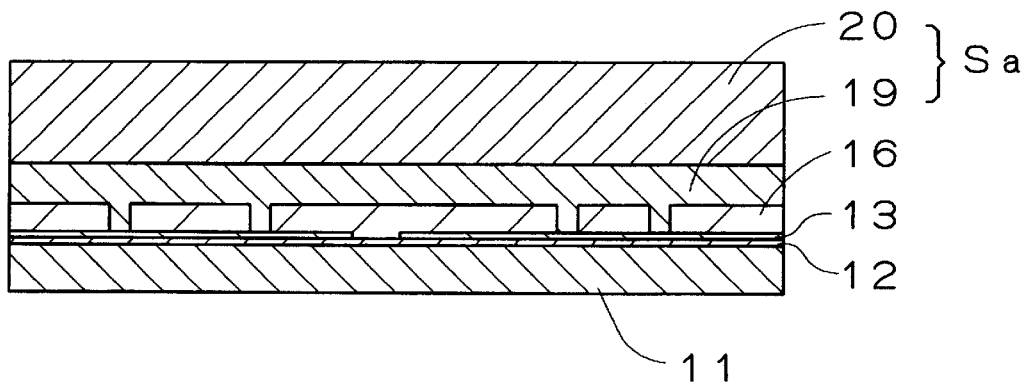
FIG. 6 shows the process drawing of the first embodiment of the production method of the micromachine of the present invention wherein sensing portions of the angular speed sensor i.e. the pectinated electrostatic oscillator and the like are formed on the silicon substrate.

Following the aforementioned processes, a polysilicon film forming step which is performed to fill the grooves 18 of the LTO layer 16 with polysilicon layers, and to make the upper surface of the polysilicon layer flat and smooth as shown in FIGS. 5 and 6.

Figure 4:
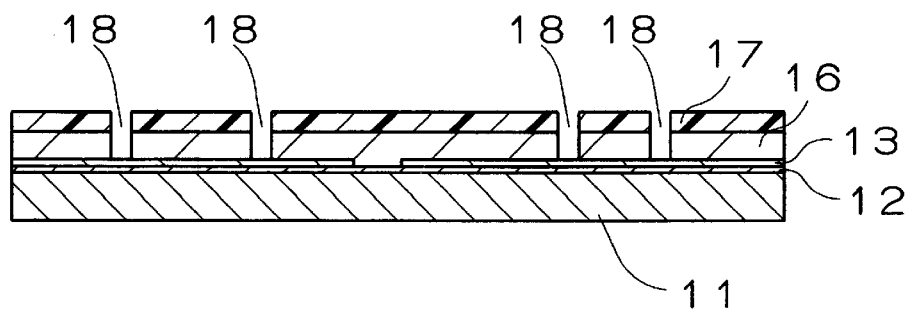
FIG. 4 shows the process drawing of the first embodiment of the production method of the micromachine of the present invention wherein sensing portions of the angular speed sensor i.e. the pectinated electrostatic oscillator and the like are formed on the silicon substrate.

After removing the resist film 17 in FIG. 4, as shown in FIG. 5, after deposition by a polysilicon layer being 1.5 µm in thickness and ion implantation are repeated twice under a low pressure chemical vapor deposition (LPCVD), a lower polysilicon layer 19 is deposited on the LTO layer 16 by thermally anealing to fill up the grooves 18, thus the above polysilicon layers become 3 µm in thickness. It is noted that the polysilicon layers are deposited under the processing temperatures which range from 500 to 650° C. and that the polysilicon layer is thermally anealed at the very most at 950±50° C.

At the step shown in FIG. 5, the grooves 18 of the LTO layer 16 is filled by depositing the polysilicon lower layer 19, thickness of which is equal to 0.625 times or above as large as the width of the grooves 18 of the LTO layer 16, whereby a "first processing step" in the "polysilicon film forming step" is performed.

At the step shown in FIG. 6, an upper polysilicon layer 20 being 12 µm in thickness is added or deposited on the lower polysilicon layer 19 by epitaxially growing a doped-polysilicon layer that phosphorous is implanted in an epitaxy device. A polysilicon layer Sa is formed by depositing the upper polysilicon layer 20 on the lower polysilicon layer 19. It is noted that the impurity concentration of the doped-polysilicon grown in the epitaxy device is set $2E19/cm^3$ and below in the same way as that of the lower polysilicon layer 19.

Accordingly, at the step shown in FIG. 6, the polysilicon layer Sa is formed by depositing the upper polysilicon layer 20 on the lower polysilicon layer 19 by means of the epitaxial growth of the doped-polysilicon layer which has the same impurity concentration as the lower polysilicon layer 19 has, the polysilicon layer Sa has therefore a predetermined thickness i.e. 15 µm, whereby a "second processing step" in the "polysilicon film forming step" is performed.

Figure 7:
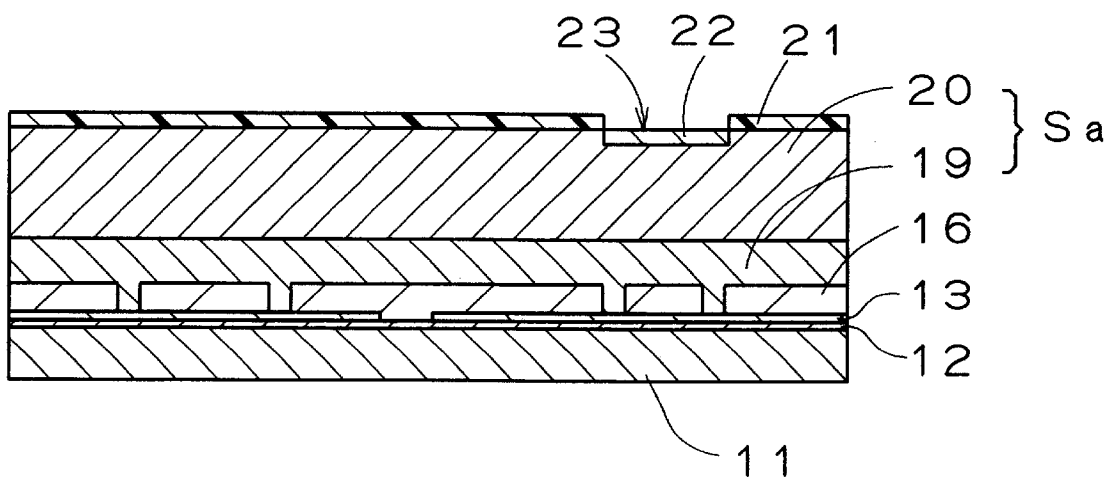
FIG. 7 shows the process drawing of the first embodiment of the production method of the micromachine of the present invention wherein sensing portions of the angular speed sensor i.e. the pectinated electrostatic oscillator and the like are formed on the silicon substrate.

After the above processing step, at the step shown in FIG. 7, a contact portion 23 is formed or patterned on the polysilicon layer Sa by coating a resist film 21 and by etching the resist film 21 with anisotropic dry etching. In addition, an n-type diffusion area 22 is formed by implanting phosphorous only to the contact portion 23.

Figure 8:
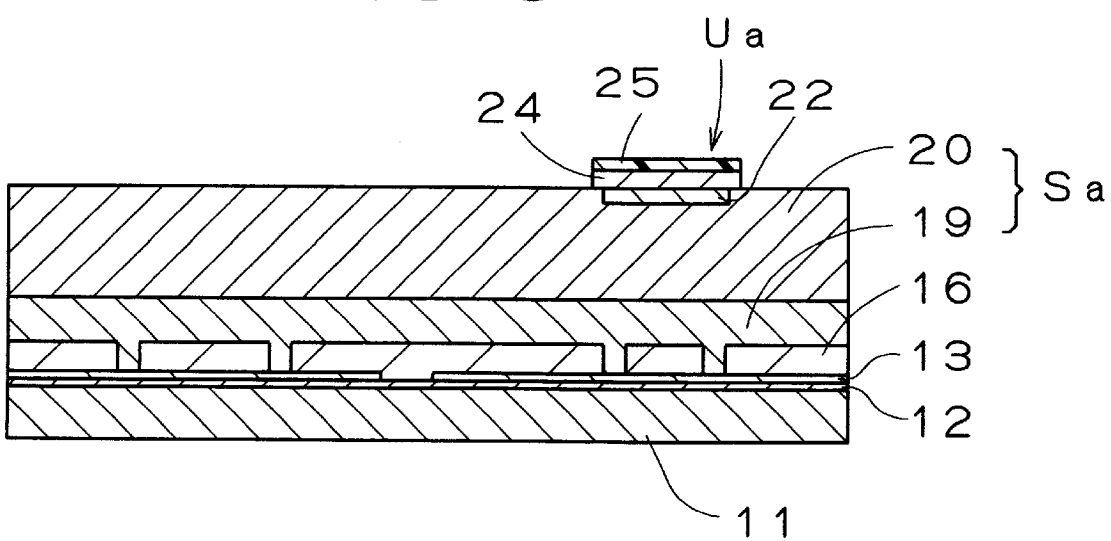
FIG. 8 shows the process drawing of the first embodiment of the production method of the micromachine of the present invention wherein sensing portions of the angular speed sensor i.e. the pectinated electrostatic oscillator and the like are formed on the silicon substrate.

After removing the resist film 21 from the silicon layer S and thermally anealing, aluminum is spattered to the whole upper surface of the polysilicon layer Sa to make the pattern of the contact portion 23. As shown in FIG. 8, the patterns of an aluminum contact 24 and a pad Ua are formed by coating a resist film 25 on the spattered aluminum layer and dissolving unnecessary part of the aluminum layer in etching.

Figure 9:
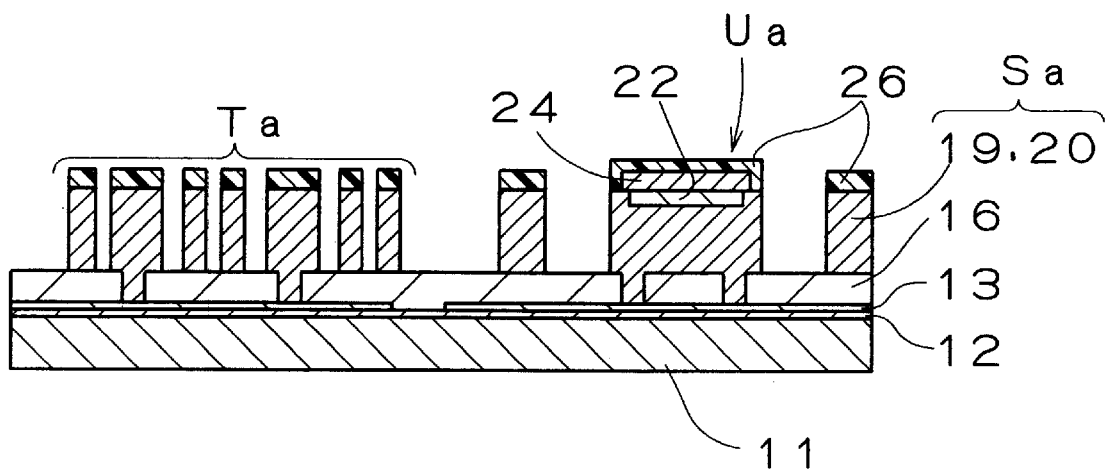
FIG. 9 shows the process drawing of the first embodiment of the production method of the micromachine of the present invention wherein sensing portions of the angular speed sensor i.e. the pectinated electrostatic oscillator and the like are formed on the silicon substrate.
Figure 10:
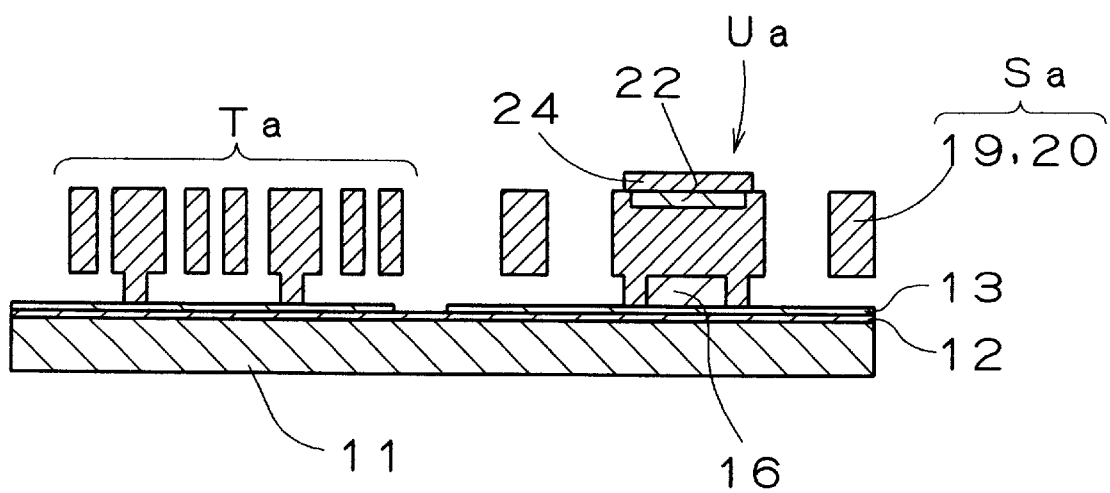
FIG. 10 shows the process drawing of the first embodiment of the production method of the micromachine of the present invention wherein sensing portions of the angular speed sensor i.e. the pectinated electrostatic oscillator and the like are formed on the silicon substrate.
Figure 11:
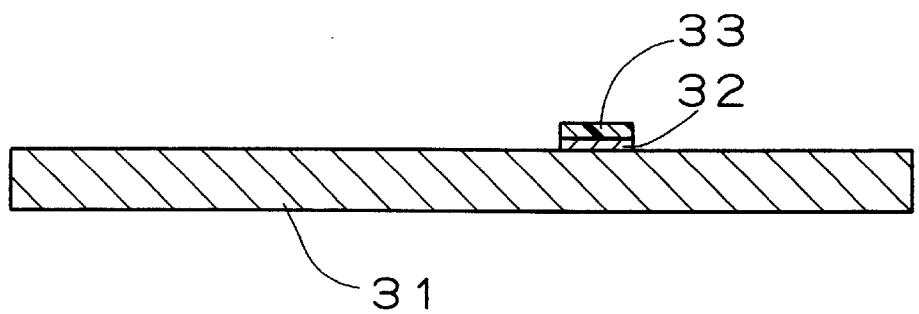
FIG. 11 shows the process drawing of the second embodiment of the production method of the micromachine of the present invention wherein sensing portions of the angular speed sensor i.e. the pectinated electrostatic oscillator and the like are formed on the silicon substrate.

After removing the resist film 25 from the aluminum contact 24 and the pad Ua, the aluminum contact 24 is sintered. At the step shown in FIG. 9, first, a pectinated electrostatic oscillator is formed by coating the resist film 26 on the upper polysilicon layer 20 and machining by aniso- tropic dry etching. Next the LTO layer 16 is removed by isotropic etching as shown in FIGS. 9 and 10, thus the resist film 26 is removed.

According to the first embodiment of the production method of the micromachine, the sensing portions of the angular speed sensor i.e. the pectinated electrostatic oscillator, the pad Ua, and the like are able to be formed on the silicon substrate 11. At the step so called a "dicing step", the resulting silicon substrate 11 is divided or cut with a die into each sensing portion of the pectinated electrostatic oscillator, the pad Ua, and the like. By going through the above dicing step and assembling the resulting sensing portions, the angular speed sensor which is one kind of the micromachining sensor is produced.

As described above, in the production method of the first embodiment, the "polysilicon film forming step", which makes the grooves 18 of the LTO layer 16 be filled with the polysilicon layer Sa, can be divided into the "first processing step" shown in FIG. 5 and the "second processing step" shown in FIG. 6.

At the "first processing step" shown in FIG. 5, the grooves 18 defined in the upper surface of the LTO layer 16 are filled by depositing the lower polysilicon layer 19 on the LTO layer 16. Then 3 µm thickness of the lower polysilicon layer 19 is 0.75 times relative to 4 µm thickness of the grooves 18 in the LTO layer 16. Thus the thickness of the lower polysilicon layer 19 is greater than 0.625 times the width of the grooves 18 formed in the LTO layer 16. The whole grooves 18 are filled by depositing the lower polysilicon layer 19, therefore inner stress in the polysilicon within the grooves 18 filled by the lower polysilicon layer 19 is rarely generated.

At the "second processing step" shown in FIG. 6, the upper polysilicon layer 20 is formed by growing the doped-silicon, then the polysilicon layer Sa is formed by depositing the resulting upper polysilicon layer 20 on the lower poly-silicon layer 19, whereby the polysilicon layer Sa obtains the predetermined thickness (15 µm in the first embodiment). The impurity concentration of the doped-silicon grown in the epitaxy device is set $2E19/cm^3$ and below in the same way as that of the lower polysilicon layer 19, thereby preventing the inner stress from generating in the upper polysilicon layer 20.

Accordingly, the polysilicon layer Sa which is formed by the lower polysilicon layer 19 and the upper polysilicon layer 20 becomes stable generally having (110) plane direction.

According to the production method of the micromachine of the first embodiment, the "polysilicon film forming step", which makes the upper surface of the polysilicon layer Sa flat and smooth by filling up the grooves 18 by the poly-silicon layer Sa, is composed of the "first processing step" and the "second processing step". The "first processing step" makes the grooves 18 be filled by the lower polysilicon layer 19 as shown in FIG. 5. While, the "second processing step" makes the upper polysilicon layer 20 having the predetermined thickness (15 µm in the first embodiment) as shown in FIG. 6. At the "first processing step" as shown in FIG. 5, the LTO layer 16 is overwrapped with the lower polysilicon layer 19 whose thickness is above 0.625 times as large as the width of the grooves 18, and the whole grooves 18 are filled with the lower polysilicon layer 19. Therefore, the inner stress in the grooves 18 filled with the lower polysilicon layer 19 is rarely generated. At the "second processing step" as shown in FIG. 6, after growing the doped-silicon which has the same impurity concentration as the lower polysilicon layer 19 has, the upper polysilicon layer 20 is added onto the lower polysilicon layer 19, which makes it possible to prevent the inner stress from generating in the upper polysilicon layer 20. In addition, the polysilicon layer Sa is made by the lower polysilicon layer 19 and the upper polysilicon layer 20, which makes it possible for the polysilicon layer Sa to have the predetermined thickness (15 μm in the first embodiment). Therefore, the production method of the micromachine of the first embodiment reduces the inner stress which is generated in the polysilicon layer Sa when the groove 18 is flattened by the polysilicon layer S having the predetermined thickness.

According to the production method of the micromachine of the first embodiment, at the first processing step in the "polysilicon film forming step", as described above, the lower polysilicon layer 19 is added onto the LTO layer 16 by anealing after the deposition of the polysilicon under the low pressure CVD and the ion implantation to the polysilicon film are repeated. This makes the lower polysilicon layer 19 be composed of fine crystals, therefore the generation of the inner stress in the grooves 18 of the LTO layer 16 can be prevented more effectively.

According to the production method of the micromachine of the first embodiment, by reducing the inner stress, the polysilicon layer Sa can be thickened to the predetermined value (15 μm). A micro structure Ta (in FIGS. 9 and 10) which has the thickness such as previously could not be formed in being floated from the silicon substrate 11 by the surface micromachining can be formed in the polysilicon layer Sa.

Accordingly, the production method of the micromachine of the first embodiment makes it possible to produce the micro structure Ta (in FIG. 10) having the thickness of tens of micro meter by surface micromachining, which is conventionally deemed to be made by a bulk micromachining.

According to the production method of the micromachine of the first embodiment, the micro structure Ta which is made by the polysilicon layer Sa thickened to the predetermined value (15 μm in the first embodiment) corresponds to the pectinated electrostatic oscillator of the micromachine, whereby the electrostatic capacity of the electrostatic oscillator can be enlarged, furthermore the output power of the angular speed sensor having the electrostatic oscillator becomes increased.

For example, if the angular speed sensor having the electrostatic oscillator is designed such that its x axis is set as a driving direction, while its y axis is set as a detecting direction, and its resonance frequency is made to be approximately 10 kHz, it will be found to be necessary for the thickness in z axis direction to be set 8/3 times relative to the smallest width in x and y axes directions by finite element method depending on the structural type of the pectinated electrostatic oscillators. If the thickness in x and y axes directions are set to be 3 μm, the thickness in the z axis direction must be above 8 μm.

To the contrary, the thickness of the polysilicon layer Sa corresponding to the thickness in the z axis of the pectinated electrostatic oscillator is made to be 15 μm. Accordingly the angular speed sensor having the aforementioned pectinated electrostatic oscillator can be made.

Next, a second embodiment will be described with reference to FIGS. 11 to 21. The production method of the micromachine of the second embodiment is the same as that of the first embodiment which includes the method for producing an angular speed sensor having a pectinated electrostatic oscillator. FIGS. 11 to 21 illustrate processes of the production method in accordance with the second embodiment, wherein sensing portions of the angular speed sensor including the pectinated electrostatic oscillator and the like are formed on a silicon substrate.

According to the production method of the second embodiment, in order to form the sensing portions of the angular speed sensor including the pectinated electrostatic oscillator and the like, first, after thermally oxidizing the p-type silicon substrate 31 to form a thermal oxidized film 32, the pattern of an underneath circuit is formed by coating the resist film 33 and machining by anisotropic dry etching.

Figure 12:
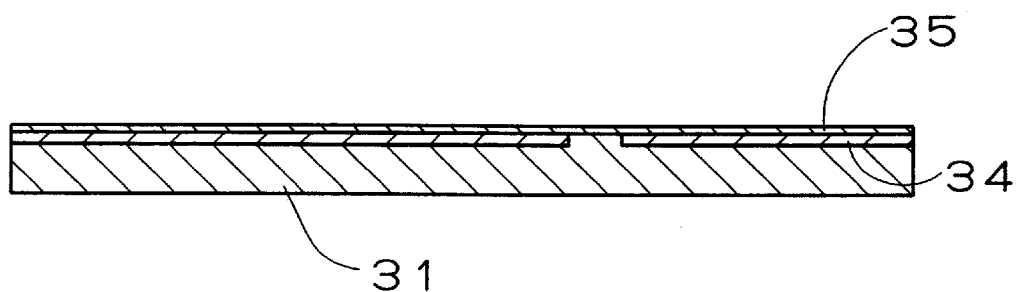
FIG. 12 shows the process drawing of the second embodiment of the production method of the micromachine of the present invention wherein sensing portions of the angular speed sensor i.e. the pectinated electrostatic oscillator and the like are formed on the silicon substrate.

Next, after implanting phosphorous to the p-type silicon substrate 31, as shown in FIG. 12, the underneath circuit of an n-type diffusion area 34 is formed in the p-type silicon substrate 31 by being diffusely oxidized after removing the resist film 33 and the thermal oxidized film 32. A thermal oxidized film 35 is simultaneously formed on the n-type diffusion area 34 and the p-type silicon substrate 31.

Figure 13:
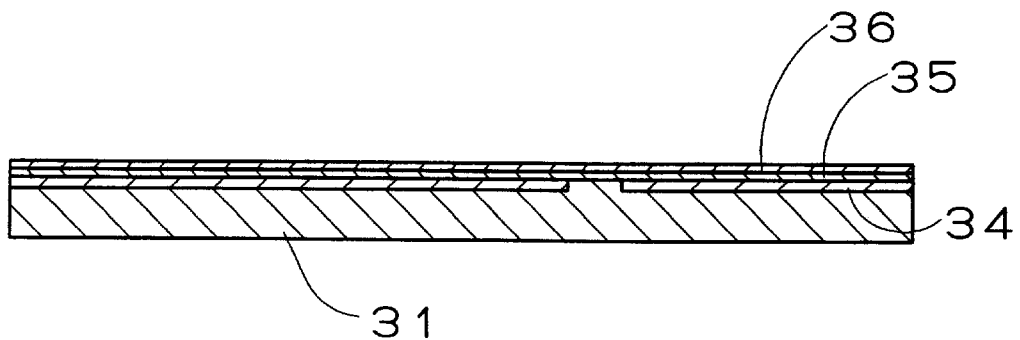
FIG. 13 shows the process drawing of the second embodiment of the production method of the micromachine of the present invention wherein sensing portions of the angular speed sensor i.e. the pectinated electrostatic oscillator and the like are formed on the silicon substrate.
Figure 14:
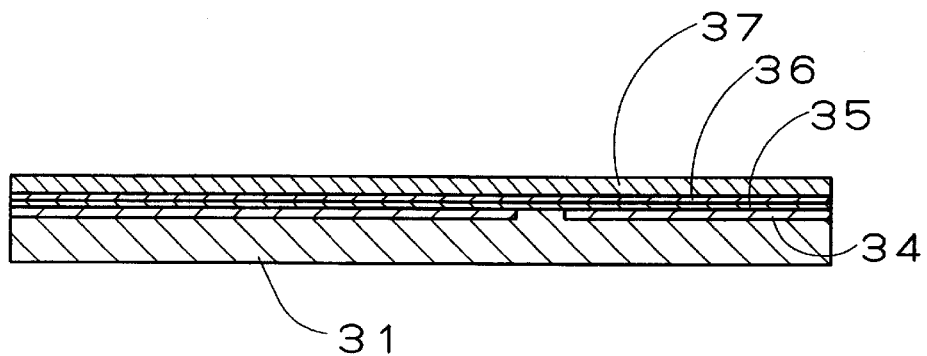
FIG. 14 shows the process drawing of the second embodiment of the production method of the micromachine of the present invention wherein sensing portions of the angular speed sensor i.e. the pectinated electrostatic oscillator and the like are formed on the silicon substrate.

In the step shown in FIG. 13, a nitride film 36 is added or formed as an etch-stop layer on the thermal oxidized film 35. Following the above step, a sacrificial layer i.e. a low temperature oxide (LTO) layer 37 is deposited as shown in FIG. 14. At the step shown in FIG. 15, the grooves 39 are formed in the upper surface of the LTO layer 37 with 4 μm width by anisotropic dry etching after coating the resist film 38. The grooves 39 are made for forming beams for supporting the pectinated electrostatic oscillator.

Figure 16:
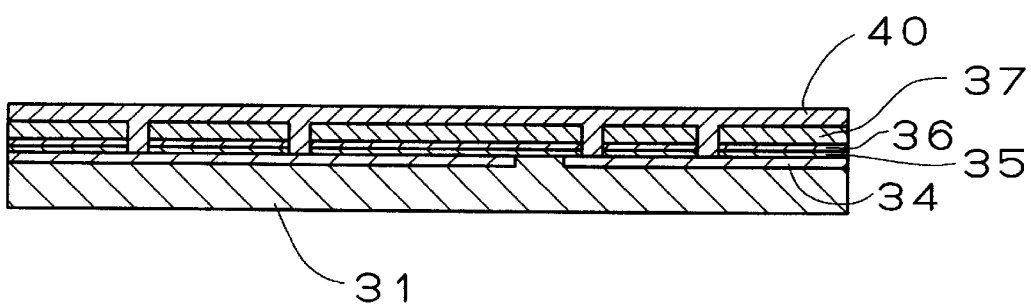
FIG. 16 shows the process drawing of the second embodiment of the production method of the micromachine of the present invention wherein sensing portions of the angular speed sensor i.e. the pectinated electrostatic oscillator and the like are formed on the silicon substrate.
Figure 17:
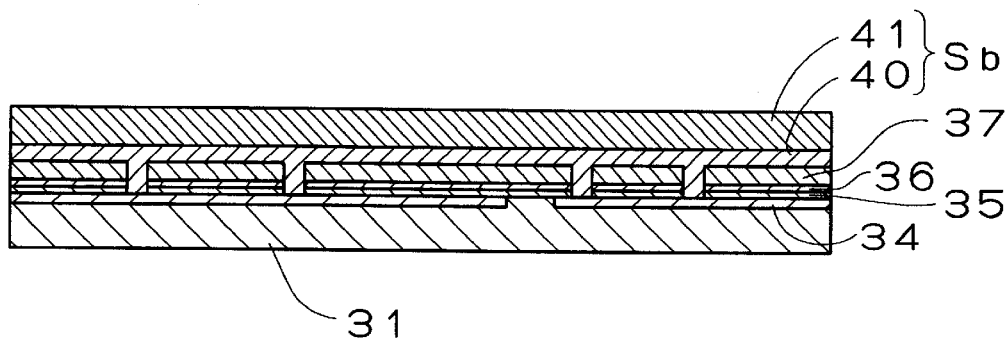
FIG. 17 shows the process drawing of the second embodiment of the production method of the micromachine of the present invention wherein sensing portions of the angular speed sensor i.e. the pectinated electrostatic oscillator and the like are formed on the silicon substrate.
Figure 18:
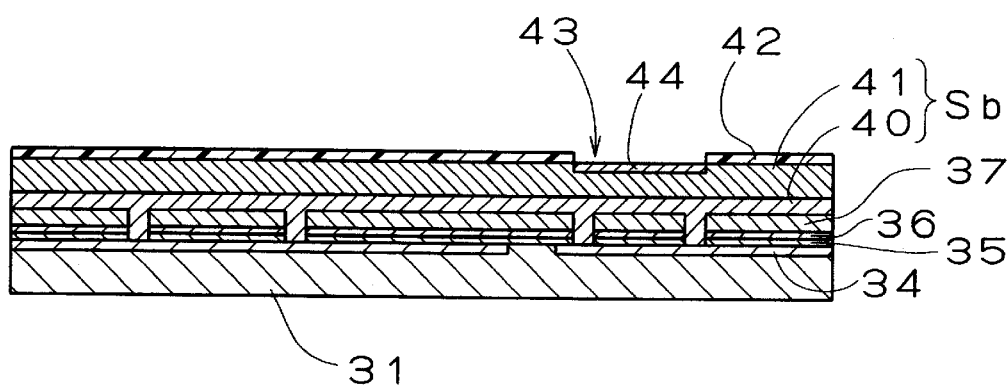
FIG. 18 shows the process drawing of the second embodiment of the production method of the micromachine of the present invention wherein sensing portions of the angular speed sensor i.e. the pectinated electrostatic oscillator and the like are formed on the silicon substrate.

Following the aforementioned processes, a "polysilicon film forming step" which is performed to fill the grooves 39 of the LTO layer 37 with polysilicon layer, and to make the upper surface of the polysilicon layer flat and smooth as shown in FIGS. 16 and 17.

Figure 15:
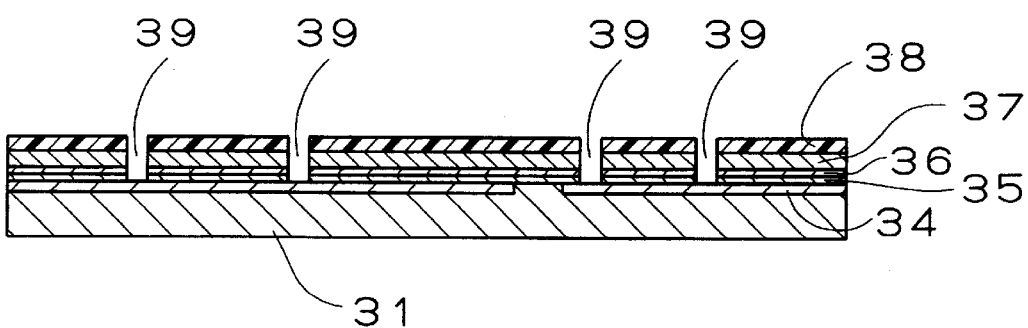
FIG. 15 shows the process drawing of the second embodiment of the production method of the micromachine of the present invention wherein sensing portions of the angular speed sensor i.e. the pectinated electrostatic oscillator and the like are formed on the silicon substrate.

After removing the resist film 38 in FIG. 15, deposition of a polysilicon layer having a thickness of 1.5 μm and ion implantation to the above polysilicon layer are repeated twice under the low pressure chemical vapor deposition (LPCVD), by thermally anealing the above polysilicon layer, a polysilicon lower layer 40 having a thickness of 3 μm is deposited on the LTO layer 37 in addition to stuffing the grooves 39. It is noted that the polysilicon layers are deposited at the processing temperature of 610° C. and that the polysilicon layer is thermally anealed at the very most at 950° C.

Accordingly, as shown in FIG. 16, the grooves 39 formed on the LTO layer 37 is stuffed or flattened by means of adding or depositing a lower polysilicon layer 40 having a thickness of 0.625 times as large as the width of the grooves 39 on the LTO layer 37, whereby a "first processing step" in a "polysilicon film forming step" is performed.

Additionally, as shown in FIG. 17, a polysilicon layer Sb is formed by depositing an upper polysilicon layer 41 on the lower polysilicon layer 40. The polysilicon layer 41 is made from the doped-polysilicon layer grown in the epitaxy device. It is noted that the doped-polysilicon layer has the same impurity concentration of the lower polysilicon layer 40, below $2E19/cm^3$, and that the doped-polysilicon layer is grown at atmospheric pressure and in the processing at most temperature of 950° C.

At the step shown in FIG. 17, the polysilicon layer Sb is formed by depositing the upper polysilicon layer 41 on the lower polysilicon layer 40 by means of the epitaxial growth of the doped-polysilicon layer which has the same impurity concentration of the lower polysilicon layer 40, and the polysilicon layer Sb has therefore a predetermined thickness i.e. 15 μm, whereby a "second processing step" in the "polysilicon film forming step" is performed.

At the step shown in FIG. 7, the pattern of a contact portion 43 is formed by means of a coating of a resist film 42 on the polysilicon layer Sb and machining over the resist film 42 by anisotropic dry etching. In addition, an n-type diffusion area 44 is formed by implanting phosphorous only to the contact portion 43.

Figure 19:
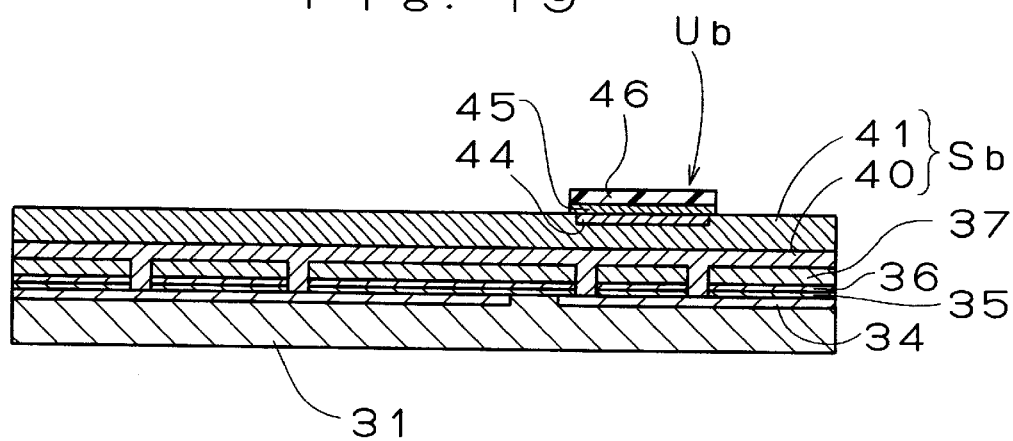
FIG. 19 shows the process drawing of the second embodiment of the production method of the micromachine of the present invention wherein sensing portions of the angular speed sensor i.e. the pectinated electrostatic oscillator and the like are formed on the silicon substrate.

After removing the resist film 42 and thermal anealing, aluminum is spattered to the whole upper surface of the polysilicon layer Sb. As shown in FIG. 19, the patterns of an aluminum contact 45 and a pad Ub are formed by coating a resist film 46 on the spattered aluminum layer and dissolving unnecessary part of the aluminum layer by etching.

Figure 20:
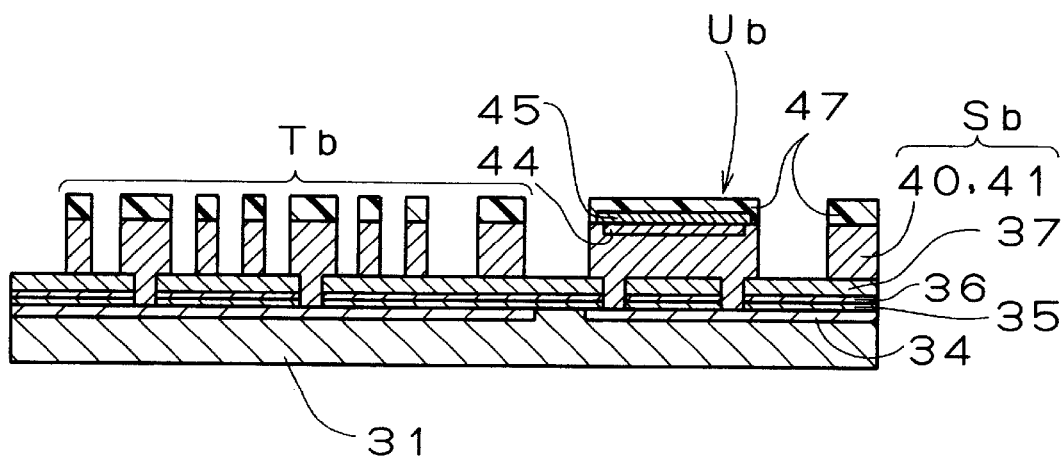
FIG. 20 shows the process drawing of the second embodiment of the production method of the micromachine of the present invention wherein sensing portions of the angular speed sensor i.e. the pectinated electrostatic oscillator and the like are formed on the silicon substrate.
Figure 21:
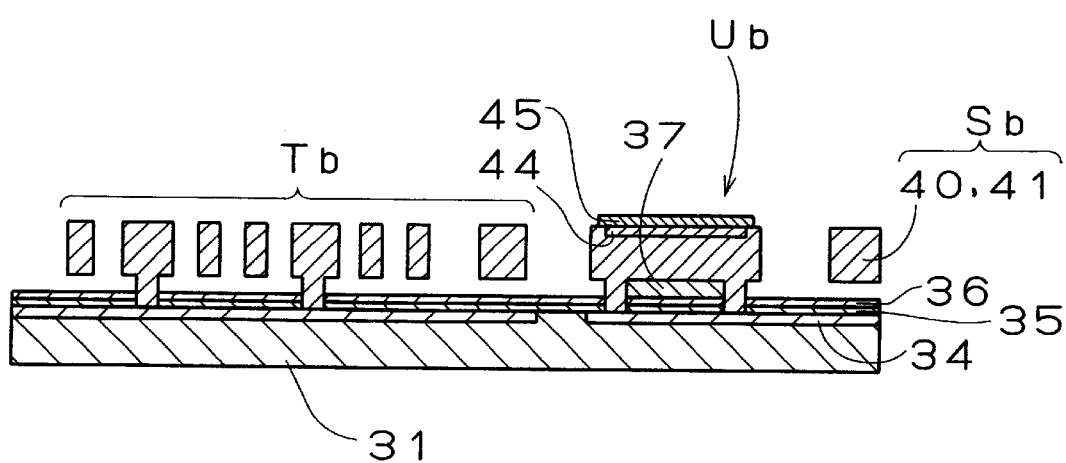
FIG. 21 shows the process drawing of the second embodiment of the production method of the micromachine of the present invention wherein sensing portions of the angular speed sensor i.e. the pectinated electrostatic oscillator and the like are formed on the silicon substrate.

After removing the resist film 46, the aluminum contact 45 is sintered. Furthermore, as shown in FIG. 19, a pectinated electrostatic oscillator is formed by coating the resist film 46 on the upper polysilicon layer 41 and machining by anisotropic dry etching. Next the LTO layer 37 is etched by hydrofluoric acid in isotropic etching as shown in FIGS. 20 and 21, after that, the resist film 47 is removed.

According to the second embodiment of the production method of the micromachine, the sensing portions of the angular speed sensor i.e. the pectinated electrostatic oscillator, the pad Ub, and the like are able to be formed on the silicon substrate 31. At the step so called a "dicing step", the resulting silicon substrate 31 is divided with a die into each sensing portion of the pectinated electrostatic oscillator, the pad Ub, and the like. After the dicing step and assembling of the sensing portions, the angular speed sensor i.e. one of the micromachining sensor is produced.

As described above, in the production method of the second embodiment, the "polysilicon film forming step", which makes the grooves 39 defined in the LTO layer 37 filled with the polysilicon layer Sb, can be divided into the "first processing step" shown in FIG. 16 and the "second processing step" shown in FIG. 17.

At the "first processing step" shown in FIG. 16, the grooves 39 defined in the LTO layer 37 are filled or flattened by depositing the lower polysilicon layer 40 on the LTO layer 37. Then 3 μm thickness of the lower polysilicon layer 40 is 0.75 times relative to 4 μm thickness of the grooves 39 in the LTO layer 37. Thus the thickness of the lower polysilicon layer 40 is larger than the thickness 0.625 times as large as the width of the grooves 39 formed in the LTO layer 37. The whole grooves 39 are filled or flattened by the lower polysilicon layer 40, therefore inner stress because of the stuffing portion of the lower polysilicon layer 40 in the grooves 39 is rarely generated.

At the "second processing step" shown in FIG. 17, the upper polysilicon layer 41 is made by growing the doped-silicon, then the polysilicon layer Sb is formed by depositing the resulting upper polysilicon layer 41 on the lower polysilicon layer 40, whereby the polysilicon layer Sb obtains the predetermined thickness i.e. 15 μm. The impurity concentration of the doped-silicon grown in the epitaxy device is set below $2E19/cm^3$ in the same way as that of the lower polysilicon layer 40, which prevents the inner stress from generating in the upper polysilicon layer 41.

Accordingly, the polysilicon layer Sb which is formed by the lower polysilicon layer 40 and the upper polysilicon layer 41, becomes stable generally having (110) plane direction.

According to the production method of the micromachine of the second embodiment, the "polysilicon film forming step", which makes the upper surface of the polysilicon layer Sb flat and smooth by filling up the grooves 39 with the polysilicon layer Sb, is processed by the "first processing step" and the "second processing step". The grooves 39 is defined in the LTO layer 37 which is formed on the whole upper surface of the silicon substrate 31. The first step makes the grooves 39 filled with the lower polysilicon layer 40 as shown in FIG. 16. While, the "second processing step" makes the polysilicon layer Sb have the predetermined thickness (15 μm in the first embodiment) as shown in FIG. 17. In "the first processing step" as shown in FIG. 16, the LTO layer 37 is overwrapped with the lower polysilicon layer 40 whose thickness is above 0.625 times as large as the width of the groove 39, the whole grooves 39 are filled with the lower polysilicon layer 40. Therefore, the inner stress because of the stuffing portion of the lower polysilicon layer 40 in the grooves 39 is rarely generated. At the "second processing step" as shown in FIG. 17, after growing the doped-silicon which has the same impurity concentration as the lower polysilicon layer 40, the upper polysilicon layer 41 is added onto the lower polysilicon layer 40, which makes it possible to prevent the inner stress from generating in the upper polysilicon layer 41. In addition, the polysilicon layer Sb is made by the lower polysilicon layer 40 and the upper polysilicon layer 41, which makes it possible for the polysilicon layer Sb to have the predetermined thickness (15 μm in the first embodiment). Therefore, the production method of the micromachine of the first embodiment reduces the inner stress which is generated in the polysilicon layer Sb when the grooves 39 is flattened by the polysilicon layer S having the predetermined thickness.

According to the production method of the micromachine of the second embodiment, at the first processing step in the polysilicon film forming step, as described above, the lower polysilicon layer 40 is added to the LTO layer 37 by anealing after the deposition of the polysilicon under the low pressure CVD and the ion implantation to the polysilicon film are repeated. This makes the lower polysilicon layer 40 be composed of fine crystals, therefore the generation of the inner stress in the grooves 39 of the LTO layer 37 can be prevented more effectively.

According to the production method of the micromachine of the second embodiment, by reducing the inner stress, the polysilicon layer Sb can be thickened to the predetermined value (15 μm in the second embodiment). A micro structure Tb (in FIGS. 20 and 21) which has the thickness such as previously could not be formed in being floated from the silicon substrate 31 by the surface micromachining can be formed in the polysilicon layer Sb.

Accordingly, the production method of the micromachine of the second embodiment makes it possible to produce a micro structure Tb (in FIG. 21) having the thickness of tens of micro meter by surface micromachining, which is conventionally deemed to be made by a bulk micromachining.

According to the production method of the micromachine of the second embodiment, the micro structure Tb which is made by the polysilicon layer Sb thickened to the predetermined value (15 μm in the second embodiment) corresponds to the pectinated electrostatic oscillator of the micromachine, whereby the electrostatic capacity of the electrostatic oscillator can be enlarged, furthermore the output power of the angular speed sensor having the electrostatic oscillator is increased.

For example, if the angular speed sensor having the electrostatic oscillator is designed such that its x axis is set as a driving direction, while its y axis is set as a detecting direction, and its resonance frequency is made to be approximately 10 kHz, it will be found to be necessary for the thickness in z axis direction to be set 8/3 times as large as the smallest width in x and y axes directions by the finite element method, depending on the structural type of the pectinated electrostatic oscillators. If the smallest width in x and y axes directions are set to be 3 μm, the thickness in the z axis direction must be above 8 μm.

To the contrary, the thickness of the polysilicon layer S corresponding to the thickness in the z axis of the pectinated electrostatic oscillator is made to be 15 μm. Accordingly the angular speed sensor having the aforementioned pectinated electrostatic oscillator can be made.

Many change and modifications can be made without departing from the spirit or scope of the invention as described. For example, although the process wherein the deposition and thermal anealing of the polysilicon layers is repeated under the low pressure chemical vapor deposition LPCVD is employed in order that the lower polysilicon layers 19 and 40 are deposited on the upper polysilicon layers 16, 37, respectively, another process wherein the doped-polysilicon layers are grown in low pressure can be employed.

Having now fully described the invention, it will be apparent to one of ordinary skill in the art that many change and modifications can be made without departing from the spirit or scope of the invention as set forth herein.

What is claimed is:

1. A production method of a micromachine including a polysilicon film forming step for flattening grooves defined in a sacrificial layer formed on a surface of a silicon substrate by overlaying a polysilicon layer, the production method of the micromachine comprising the steps of:

(a) a first processing step for filling the grooves by adding a lower laid portion of the polysilicon layer on the sacrificial layer, the lower laid portion having a thickness greater than 0.625 times the maximum width of the grooves; and (b) a second processing step for forming the polysilicon layer with a predetermined thickness by adding an upper laid portion of the polysilicon layer on the lower laid portion, the upper laid portion being formed by depositing polysilicon which has the same impurity concentration as the lower laid portion does.

2. The production method of the micromachine in accordance with claim 1, wherein the first processing step adds the lower laid portion onto the sacrificial layer by thermal anealing after repeating a deposition of the polysilicon and an ion implantation with a low pressure chemical vapor deposition.

3. The production method of the micromachine in accordance with claim 1, wherein a micro structure floating apart from the silicon substrate is formed in the polysilicon layer.

4. The production method of the micromachine in accordance with claim 3, wherein the micro structure is an oscillator of a micromachine sensor.

* * * * *